(12) United States Patent
Guo et al.

(10) Patent No.: US 12,272,524 B2
(45) Date of Patent: Apr. 8, 2025

(54) WIDEBAND VARIABLE IMPEDANCE LOAD FOR HIGH VOLUME MANUFACTURING QUALIFICATION AND ON-SITE DIAGNOSTICS

(71) Applicant: Applied Materials, Inc., Santa Clara, CA (US)

(72) Inventors: Yue Guo, Redwood City, CA (US); Kartik Ramaswamy, San Jose, CA (US); Jie Yu, Santa Clara, CA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 17/947,675

(22) Filed: Sep. 19, 2022

(65) Prior Publication Data
US 2024/0094273 A1  Mar. 21, 2024

(51) Int. Cl.
*H01J 37/32* (2006.01)

(52) U.S. Cl.
CPC .. *H01J 37/32183* (2013.01); *H01J 37/32917* (2013.01); *H01J 2237/24592* (2013.01)

(58) Field of Classification Search
CPC ........... H01J 37/32174; H01J 37/32183; H01J 37/32917; H01J 2237/24592; H05H 2242/26; H03H 7/38; H03H 7/40
See application file for complete search history.

(56) References Cited

U.S. PATENT DOCUMENTS

| | | | |
|---|---|---|---|
| 4,070,589 | A | 1/1978 | Martinkovic |
| 4,340,462 | A | 7/1982 | Koch |
| 4,464,223 | A | 8/1984 | Gorin |
| 4,504,895 | A | 3/1985 | Steigerwald |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

Wang, S.B., et al.—"Control of ion energy distribution at substrates during plasma processing," Journal of Applied Physics, vol. 88, No. 2, Jul. 15, 2000, pp. 643-646.

(Continued)

*Primary Examiner* — Steven L Yeninas
(74) *Attorney, Agent, or Firm* — Patterson + Sheridan, LLP

(57) ABSTRACT

A wideband variable impedance load for high volume manufacturing qualification and diagnostic testing of a radio frequency power source, an impedance matching network and RF sensors for generating plasma in a semiconductor plasma chamber for semiconductor fabrication processes. The wideband variable impedance load may comprise a fixed value resistance operable at a plurality of frequencies and coupled with a variable impedance network capable of transforming the fixed value resistance into a wide range of complex impedances at the plurality of frequencies. Response times and match tuning element position repeat- (Continued)

ability may be verified. Automatic testing, verification and qualification of production and field installed radio frequency power sources for plasma generation are easily performed.

15 Claims, 10 Drawing Sheets

(56) References Cited

U.S. PATENT DOCUMENTS

| | | |
|---|---|---|
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,490,536 B1 * | 12/2002 | Ellingboe ......... H01J 37/32174 702/117 |
| 6,535,785 B2 | 3/2003 | Johnson et al. |
| 6,621,674 B1 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |

(56) References Cited

U.S. PATENT DOCUMENTS

| | | |
|---|---|---|
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall, III et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |

(56) References Cited

U.S. PATENT DOCUMENTS

| | | |
|---|---|---|
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,134,569 B1 | 11/2018 | Albarede et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapiski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 11,476,090 B1 | 10/2022 | Ramaswamy et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0021094 A1 | 2/2004 | Johnson et al. |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |

(56) References Cited

U.S. PATENT DOCUMENTS

| | | |
|---|---|---|
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0152678 A1* | 7/2007 | Matoba ............... H01J 37/321 324/601 |
| 2007/0196977 A1 | 8/2007 | Wang et al. |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0214811 A1* | 9/2011 | Ashida ............... C23F 1/08 333/33 |
| 2011/0234201 A1* | 9/2011 | Tanaka ............... H01J 37/32935 324/76.39 |
| 2011/0238360 A1* | 9/2011 | Tanaka ............... G01R 35/005 702/116 |
| 2011/0259851 A1 | 10/2011 | Brouk et al. |
| 2011/0281438 A1 | 11/2011 | Lee et al. |
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0026381 A1 | 1/2013 | Huang et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0203821 A1* | 7/2014 | Yamamoto ............... H01L 22/14 324/654 |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |

(56) References Cited

U.S. PATENT DOCUMENTS

| | | |
|---|---|---|
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0219706 A1 | 7/2020 | Koshimizu |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2021/0398785 A1 | 12/2021 | Lin et al. |
| 2022/0037121 A1 | 2/2022 | Dorf et al. |
| 2022/0238307 A1* | 7/2022 | Evans ............... H01J 37/32174 |
| 2022/0392750 A1 | 12/2022 | Yang et al. |
| 2022/0399183 A1 | 12/2022 | Cui et al. |
| 2022/0399186 A1 | 12/2022 | Cui et al. |
| 2022/0399189 A1 | 12/2022 | Guo et al. |
| 2022/0406567 A1 | 12/2022 | Yang et al. |
| 2022/0415614 A1 | 12/2022 | Yang et al. |
| 2023/0071168 A1 | 3/2023 | Ramaswamy et al. |
| 2023/0087307 A1 | 3/2023 | Guo et al. |
| 2023/0170192 A1 | 6/2023 | Guo et al. |
| 2023/0170194 A1 | 6/2023 | Guo et al. |

FOREIGN PATENT DOCUMENTS

| | | |
|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2016610 A1 | 1/2009 |

(56) References Cited

FOREIGN PATENT DOCUMENTS

| | | |
|---|---|---|
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| JP | 2021503700 A | 2/2021 |
| KR | 100757347 B1 | 9/2007 |
| KR | 10-2007-0098556 A | 10/2007 |
| KR | 10-2009-0010608 A | 1/2009 |
| KR | 20160042429 A | 4/2016 |
| KR | 20200036947 A | 4/2020 |
| TW | 498706 B | 8/2002 |
| TW | 201717247 A | 5/2017 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |
| WO | 2015073921 A8 | 5/2016 |
| WO | 2016104098 A1 | 6/2016 |
| WO | 2016128384 A1 | 8/2016 |
| WO | 2016131061 A1 | 8/2016 |
| WO | 2016170989 A1 | 10/2016 |
| WO | 2017172536 A1 | 10/2017 |
| WO | 2017208807 A1 | 12/2017 |
| WO | 2018048925 A1 | 3/2018 |
| WO | 2018111751 A1 | 6/2018 |
| WO | 2018170010 A1 | 9/2018 |
| WO | 2018197702 A1 | 11/2018 |
| WO | 2018217349 A1 | 11/2018 |
| WO | 2019036587 A1 | 2/2019 |
| WO | 2019040949 A1 | 2/2019 |
| WO | 2019099102 A1 | 5/2019 |
| WO | 2019099870 A1 | 5/2019 |
| WO | 2019185423 A1 | 10/2019 |
| WO | 2019225184 A1 | 11/2019 |
| WO | 2019239872 A1 | 12/2019 |
| WO | 2019244697 A1 | 12/2019 |
| WO | 2019244698 A1 | 12/2019 |
| WO | 2019244734 A1 | 12/2019 |
| WO | 2019245729 A1 | 12/2019 |
| WO | 2020004048 A1 | 1/2020 |
| WO | 2020017328 A1 | 1/2020 |
| WO | 2020022318 A1 | 1/2020 |
| WO | 2020022319 A1 | 1/2020 |
| WO | 2020026802 A1 | 2/2020 |
| WO | 2020033931 A1 | 2/2020 |
| WO | 2020036806 A1 | 2/2020 |
| WO | 2020037331 A1 | 2/2020 |
| WO | 2020046561 A1 | 3/2020 |
| WO | 2020051064 A1 | 3/2020 |
| WO | 2020112921 A1 | 6/2020 |
| WO | 2020121819 A1 | 6/2020 |
| WO | 2020145051 A1 | 7/2020 |
| WO | 2021003319 A1 | 1/2021 |
| WO | 2021062223 A1 | 4/2021 |
| WO | 2021097459 A1 | 5/2021 |
| WO | 2021134000 A1 | 7/2021 |

OTHER PUBLICATIONS

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"In Situ Testing of EHT Integrators on a Tokamak," 2015, 1 page.

Eagle Harbor Technologies webpage—High Gain and Frequency Ultra-Stable Integrators for Long Pulse and/or High Current Applications, 2018, 1 page.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—"Long-Pulse Integrator Testing with DIII-D Magnetic Diagnostics," 2016, 1 page.

Sunstone Circuits—"Eagle Harbor Tech Case Study," date unknown, 4 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

(56) References Cited

OTHER PUBLICATIONS

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.
Semiconductor Components Industries, LLC (SCILLC)—"Switch-Mode Power Supply" Reference Manual, SMPSRM/D, Rev. 4, Apr. 2014, ON Semiconductor, 73 pages.
PCT International Search Report and Written Opinion dated Nov. 9, 2018, for International Application No. PCT/US2018/043032.
Taiwan Office Action for Application No. 107125613 dated Dec. 24, 2020, 16 pages.
PCT International Search Report and Written Opinion dated Nov. 7, 2018, for International Application No. PCT/US2018/042965.
International Search Report and Written Opinion for PCT/US2019/052067 dated Jan. 21, 2020.
Electrical 4 U webpage—"Clamping Circuit," Aug. 29, 2018, 9 pages.
Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.
PCT Notification of Transmittal of the International Search Report and the Written Opinion of the International Searching Authority for International Application No. PCT/US2019/048392; dated Dec. 16, 2019; 13 pages.
PCT International Search Report and Written Opinion dated Nov. 7, 2018, for International Application No. PCT/US2018/042961.
PCT International Search Report and Written Opinion dated Nov. 7, 2018, for International Application No. PCT/US2018/042956.
U.S. Appl. No. 62/433,204; entitled Creating Arbitrarily-Shaped Ion Energy Distribution Function (IEDF) Using Shaped-Pulse (EV) Bias; by Leonid Dorf, et al.; filed Dec. 16, 2016; 22 total pages.
U.S. Appl. No. 15/424,405; entitled System for Tunable Workpiece Biasing in a Plasma Reactor; by Travis Koh, et al.; filed Feb. 3, 2017; 29 total pages.
U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.
PCT Notification of Transmittal of the International Search Report and the Written Opinion of the International Searching Authority for International Application No. PCT/US2018/046171; dated Nov. 28, 2018; 10 total pages.
PCT Notification of Transmittal of the International Search Report and the Written Opinion of the International Searching Authority for International Application No. PCT/US2018/046182; dated Nov. 30, 2018; 10 total pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.
Lin, Jianliang, et al.,—"Diamond like carbon films deposited by HiPIMS using oscillatory voltage pulses," Surface & Coatings Technology 258, 2014, published by Elsevier B.V., pp. 1212-1222.
PCT/US2020/014453 Interanational Search Report and Written Opinion dated May 14, 2020 consists of 8 pages.
S.B. Wang et al. "Ion Bombardment Energy and SiO 2/Si Fluorocarbon Plasma Etch Selectivity", Journal of Vacuum Science & Technology A 19, 2425 (2001).
Korean Office Action for 10-2020-7007495 dated Jun. 14, 2021.
Zhen-hua Bi et al., A brief review of dual-frequency capacitively coupled discharges, Current Applied Physics, vol. 11, Issue 5, Supplement, 2011, pp. S2-S8.
Chang, Bingdong, " Oblique angled plasma etching for 3D silicon structures with wiggling geometries" 31(8), [085301]. https://doi.org/10.1088/1361-6528/ab53fb. DTU Library. 2019.
Michael A. Lieberman, "A short course of the principles of plasma discharges and materials processing", Department of Electrical Engineering and Computer Sciences University of California, Berkeley, CA 94720.
Dr. Steve Sirard, "Introduction to Plasma Etching", Lam Research Corporation. 64 pages.
Zhuoxing Luo, B.S., M.S, "RF Plasma Etching With a DC Bias" A Dissertation in Physics. Dec. 1994.
Michael A. Lieberman, "Principles of Plasma Discharges and Material Processing", A Wiley Interscience Publication. 1994.
Yiting Zhang et al. "Investigation of feature orientation and consequences of ion tilting during plasma etching with a three-dimensional feature profile simulator", Nov. 22, 2016.
Richard Barnett et al. A New Plasma Source for Next Generation MEMS Deep Si Etching: Minimal Tilt, Improved Profile Uniformity and Higher Etch Rates, SPP Process Technology Systems. 2010.
The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
Chinese Office Action for 201880053380.1 dated Dec. 2, 2021.
Taiwan Office Action for 108132682 dated Mar. 24, 2022.
International Search Report/Written Opinion issued to PCT/US2022/053455 on May 9, 2023.

\* cited by examiner

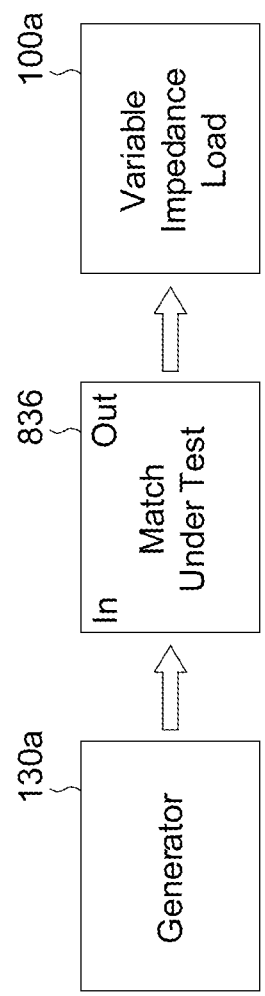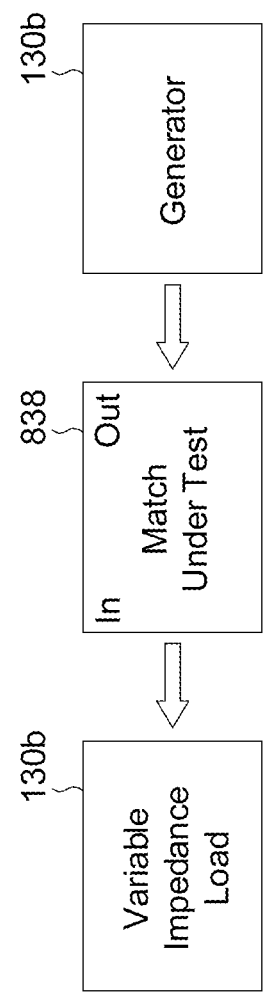

WIDEBAND VARIABLE IMPEDANCE LOAD FOR HIGH VOLUME MANUFACTURING QUALIFICATION AND ON-SITE DIAGNOSTICS

BACKGROUND

Field

Embodiments of the present disclosure generally relate to testing of high-power radio frequency (RF) power sources and impedance matching networks, and, in particular, to manufacturing qualification and diagnostic testing of an RF power source and impedance matching network adapted for generating a plasma in chamber.

Description of the Related Art

Reliably forming high aspect ratio features is one of the key technology challenges for manufacturing the next generation of semiconductor devices. High aspect ratio openings used to form the features are typically formed using a plasma-assisted etch process, such as a reactive ion etch (RIE) process capable of directionally controlled (i.e., anisotropic) material removal to transfer a pattern from a mask layer to exposed portions of the substrate surface there beneath. For plasma etching and other plasma utilizing processes, process uniformity and repeatability within a chamber, from chamber to chamber and processing system to processing system are important parameters for controlling semiconductor device yield and semiconductor device performance tolerance so that the formed semiconductor devices are able to perform as desired.

In plasma reactors, a radio frequency (RF) power source provides RF power to the plasma reactor chamber, for generating plasma therein, via an impedance matching network coupled between the RF power source and the plasma reactor chamber. The RF impedance of a plasma is a complex and highly variable function of many process parameters and conditions. The impedance matching network maximizes power transfer from the RF power source to the plasma in the reactor chamber. This is accomplished when the output impedance of the impedance matching network is equal to the complex conjugate of the input impedance of the plasma in the reactor chamber. The impedance matching network transforms the impedance of the plasma in the reactor chamber to the characteristic operating output impedance of the RF power source, e.g., 50 ohms, for optimal RF power transfer therefrom.

The RF impedance matching network is an electrical circuit disposed between the RF power source and the plasma reactor to optimize RF power transfer efficiency. In high-volume manufacturing, a qualification process is required to validate that the product will meet a design specification. A complex dummy load test is typically implemented to verify if the RF impedance matching network can tune at a desired frequency to a desired complex impedance accurately.

Multiple RF power sources at different frequencies may sometimes be utilized with plasma reactors. This includes multiple RF power sources each having an associated frequency dependent matching network. The frequency dependent matching networks may be connected to the plasma chamber at a common output point. Band pass filters may be included between each frequency dependent matching network and the plasma chamber to provide isolation for the different RF power sources.

Accurate characterization of an impedance matching network is critically important for providing reliable, efficient, and predictable plasma processes. Typically, characterization of an impedance matching network is performed with a dummy load having a complex impedance that may be coupled to the output of the impedance matching network in place of the plasma chamber.

A traditional complex impedance dummy load is thus used for such verification purposes. However, the traditional complex impedance dummy load is typically designed for only a specific impedance at a single frequency and multiple complex impedance dummy loads are required if a multi-point test is required. Also, these tests may require labor-intensive processes because an appropriate complex impedance dummy load is required to be installed manually for every RF matching network under test. In addition, an extra vector network analyzer test is sometimes needed to test RF filters, which may require technical expertise for equipment calibration and operation.

Hence, there is a need for a wideband variable impedance load operable over a plurality of frequencies for high volume manufacturing qualification and diagnostics of RF power sources and associated impedance matching networks used in plasma processes for deposition and/or etching used in the formation of, for example but is not limited to, semiconductor integrated circuits, display panels and solar panels.

SUMMARY

Embodiments of the disclosure include a wideband radio frequency (RF) variable impedance test load adapted for coupling to an RF power source used to generate a plasma in a plasma processing chamber. The RF variable impedance test load comprises a variable impedance network having a first node that may be adapted for coupling to a resistance, adjustable tuning elements for transforming the resistance coupled to the first node into a plurality of impedances at a second node, wherein the second node may be configured to be coupled to an RF power source. A test unit controller coupled to the adjustable tuning elements such that the test unit controller controls adjustment of the adjustable tuning elements for selected ones of the plurality of impedances at the second node.

Embodiments of the disclosure include a system for analyzing, qualifying or testing a radio frequency (RF) power source and impedance matching network used to generate a plasma in a plasma processing chamber with an RF variable impedance test load. The radio frequency (RF) power source including an RF generator and an impedance matching networking having an input coupled to an output of the RF generator. The wideband RF variable impedance test load includes a variable impedance network having a first node that may be adapted for coupling to a resistance, adjustable tuning elements for transforming the resistance coupled to the first node into a plurality of impedances at a second node, wherein the second node may be configured to be coupled to the output of the impedance matching networking. A test unit controller may be coupled to the adjustable tuning elements such that the controller controls adjustment of the adjustable tuning elements for selected ones of the plurality of impedances at the second node.

Embodiments of the disclosure include a method for analyzing, qualifying or testing, with a radio frequency (RF) variable impedance test load, an RF impedance matching network and components thereof used for generating a plasma in a plasma processing chamber. A resistance may be coupled to a first node of a variable impedance that transforms the resistance into a plurality of load impedances at a second node of the variable impedance network by adjusting tuning elements of the variable impedance network with a controller. The second node may be monitored by RF voltage and current sensors, and a frequency detector whose values may be used to determine impedances of the plurality of load impedances. RF power may be generated at a frequency with an RF generator having an output at a first impedance. An impedance matching network may be coupled between the output of the RF generator and the second node of the variable impedance network. The impedance of the RF generator may be matched to the plurality of load impedances at the second node of the variable impedance network with the impedance matching network.

Embodiments of the disclosure include a method for analyzing, qualifying or testing, with a radio frequency (RF) variable impedance test load, an RF impedance matching network and components thereof used for generating a plasma in a plasma processing chamber. An RF generator delivers a first RF signal through the RF impedance matching network to a first node of the variable impedance network that includes a controller, a second node that is adapted for coupling to a resistance element, adjustable tuning elements for transforming the resistance of the resistance element coupled to the second node into a plurality of load impedances at the first node, and an RF voltage sensor, an RF current sensor and a frequency detector that may be coupled between the first node and the adjustable tuning elements. Matching a first impedance of the RF generator to one of the plurality of load impedances created at the first node of the variable impedance network, where the one of the plurality of load impedances is created by adjusting one or more of the adjustable tuning elements of the impedance matching network. Comparing a signal generated by at least one of the RF voltage sensor, RF current sensor and frequency detector, while the first impedance of the RF generator is matched to the one of the plurality of load impedances, to at least one of RF voltage sensor data, RF current sensor data and frequency detector data stored in memory. Qualifying the impedance matching network if the signal from the RF voltage sensor, RF current sensor and frequency sensor are within a range set relative to the respective at least one of RF voltage sensor data, RF current sensor data and frequency detector data stored in memory.

Embodiments of the disclosure include a system for analyzing, qualifying or testing radio frequency (RF) components, comprising a variable impedance network. The variable impedance network includes a first node that is adapted for coupling to a first resistance element; and adjustable tuning elements for transforming the resistance coupled to the first node into a plurality of impedances at a second node, wherein the second node is configured to be coupled to an RF power source; and a test unit controller coupled to the adjustable tuning elements, wherein the test unit controller controls adjustment of the adjustable tuning elements for selected ones of the plurality of impedances at the second node.

Embodiments of the disclosure include a system for analyzing, qualifying or testing a radio frequency (RF) components, comprising: a radio frequency (RF) power source comprising an RF generator; and an impedance matching network having an output and input coupled to an output of the RF generator; a wideband RF variable impedance test load comprising: a variable impedance network comprising: a first node that is adapted for coupling to a resistance; and adjustable tuning elements for transforming the resistance coupled to the first node into a plurality of impedances at a second node, wherein the second node is configured to be coupled to the output of the impedance matching networking; and a test unit controller coupled to the adjustable tuning elements, wherein the test unit controller controls adjustment of the adjustable tuning elements for selected ones of the plurality of impedances at the second node.

Embodiments of the disclosure include a method of analyzing, qualifying or testing radio frequency (RF) components, comprising: delivering, by use of an RF generator, a first RF signal through an impedance matching network to a first node of the variable impedance network. The variable impedance network comprises: a controller; a second node that is adapted for coupling to a resistance element; adjustable tuning elements for transforming the resistance of the resistance element coupled to the second node into a plurality of load impedances at the first node; and an RF voltage sensor, an RF current sensor, and a frequency detector that are each coupled between the first node and the adjustable tuning elements. Then by matching, by use of the impedance matching network, a first impedance of the RF generator to one of the plurality of load impedances created at the first node of the variable impedance network, wherein the one of the plurality of load impedances is created by adjusting one or more of the adjustable tuning elements; and qualifying the impedance matching network or RF voltage sensor if a signal from the RF voltage sensor, the RF current sensor or the frequency sensor are within a range set relative to at least one of RF voltage sensor data, RF current sensor data and frequency detector data stored in memory, while the first impedance of the RF generator is matched to the one of the plurality of load impedances.

Embodiments of the disclosure include a method of analyzing, qualifying or testing radio frequency (RF) components, comprising: delivering, by use of an RF generator, a first RF signal through an impedance matching network to a first node of the variable impedance network, wherein the variable impedance network comprises: a controller; a second node that is adapted for coupling to a resistance element; adjustable tuning elements for transforming the resistance of the resistance element coupled to the second node into a plurality of load impedances at the first node; and an RF voltage sensor, an RF current sensor, and a frequency detector that are each coupled between the first node and the adjustable tuning elements; matching, by use of the impedance matching network, a first impedance of the RF generator to a first impedance of the plurality of load impedances created at the first node of the variable impedance network, wherein the first impedance of the plurality of load impedances is created by adjusting one or more of the adjustable tuning elements; and qualifying the impedance matching network or RF voltage sensor if a signal from the RF voltage sensor, the RF current sensor or the frequency sensor are within a range set relative to at least one of RF voltage sensor data, RF current sensor data and frequency detector data stored in memory, while the first impedance of the RF generator is matched to the first impedance of the plurality of load impedances. The method may also further comprise delivering, by use of an RF generator, a second RF signal through an impedance matching network to the first node of the variable impedance network; matching, by use of the impedance matching network, a second impedance of the RF generator to a second impedance of the plurality of load impedances created at the first node of the variable impedance network, wherein the second impedance of the plurality of load impedances is created by adjusting the one or more of the adjustable tuning elements; and wherein the qualifying the impedance matching network or RF voltage sensor further comprises qualifying the impedance matching network or RF voltage sensor if a signal from the RF voltage sensor, the RF current sensor or the frequency sensor is within a range set relative to at least one of RF voltage sensor data, RF current sensor data and frequency detector data stored in memory while the first impedance of the RF generator is matched to the first impedance of the plurality of load impedances and the second impedance of the RF generator is matched to the second impedance of the plurality of load impedances.

BRIEF DESCRIPTION OF THE DRAWINGS

So that the manner in which the above recited features of the present disclosure can be better understood in detail, a more particular description of the disclosure, briefly summarized herein, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 8A and 8B are schematic block diagrams of forward and reverse RF transmission configurations, respectively, for match tuning and filter performance qualifications, according to specific example embodiments of this disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
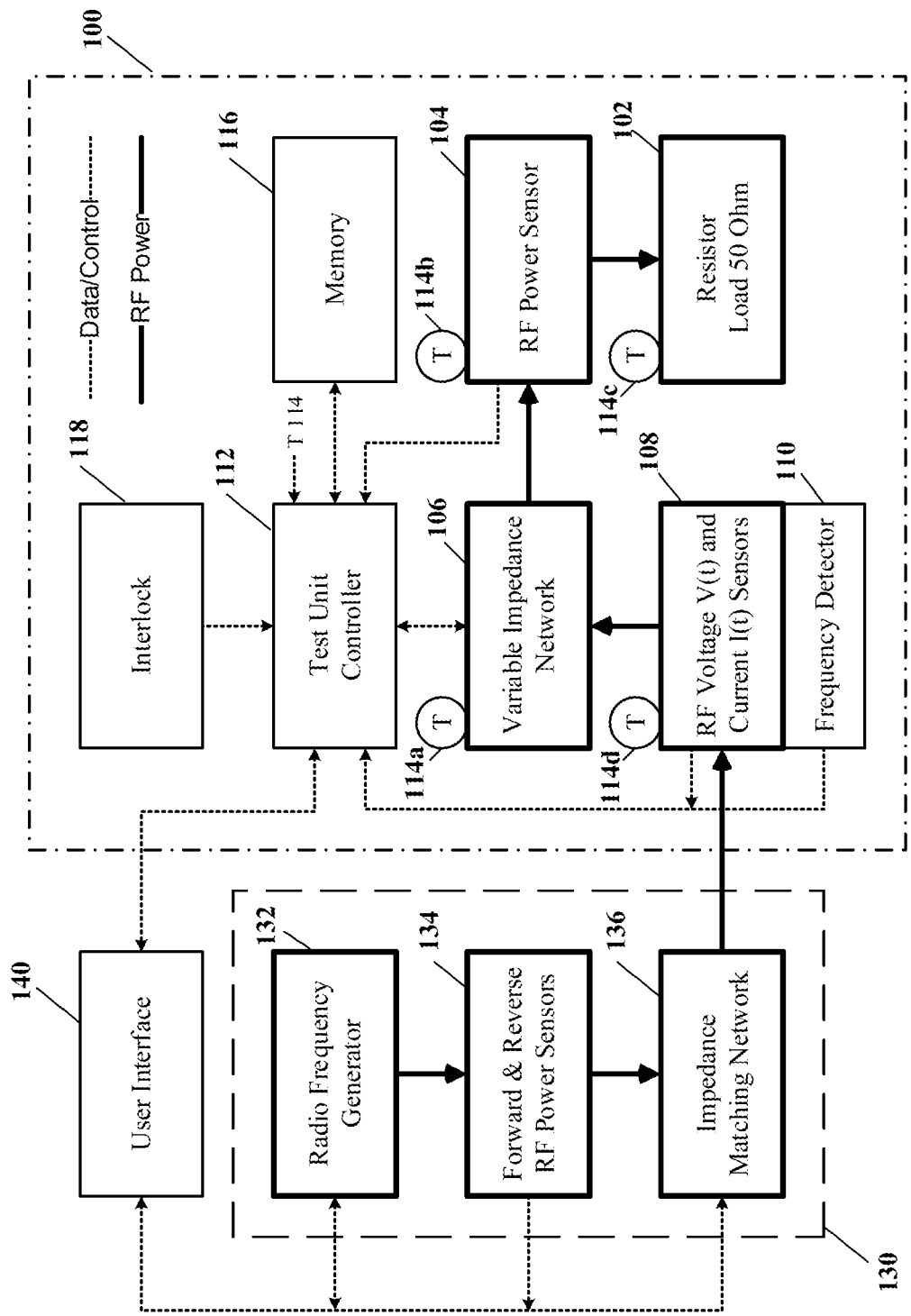
FIG. 1 illustrates a schematic block diagram of a wideband variable impedance test load coupled to an RF generator and impedance matching network, according to specific example embodiments of this disclosure.

Embodiments of the present disclosure generally relate to apparatus and methods for testing and verification of equipment used in the manufacture of semiconductor devices. More specifically, embodiments provided herein generally include apparatus and methods for testing and verifying operation of radio frequency (RF) power generation and impedance matching equipment used for generating a plasma in a plasma chamber during semiconductor processing therein.

Embodiments for a wideband variable impedance load for high volume manufacturing qualifications and diagnostics of a radio frequency (RF) power source and impedance matching network are disclosed herein. The wideband variable impedance load may comprise a fixed value resistor operable at a plurality of frequencies and coupled with a variable impedance network capable of transforming the fixed value resistor into a plurality of complex impedances over a wide range of frequencies, e.g., from about 100 kHz to about 250 Mhz. The variable impedance network may comprise various adjustable and/or switched fixed value elements, e.g., variable value capacitors and switched fixed value inductors and capacitors to cover such a wide range of frequencies and impedances.

As used herein a "plurality of impedances" and a "plurality of frequencies" may be interpreted to be in context different impedances at different frequencies, different impedances at the same frequency, or different frequencies at the same impedance. The term "wideband" may be interpreted to mean over a wide range of different frequencies, and "wide range" may be interpreted to mean over a large number of different values. The terms "recording" and "storing in a memory" e.g., data, may be used interchangeably herein.

An adjustable wideband complex impedance load is disclosed that may be used in high-volume qualification testing of high-power RF generators and impedance matching networks, for example but not limited to, for plasma processing chambers. The adjustable wideband complex impedance load is capable of being set to a plurality of different complex impedances over a wide range of different frequencies. Change of impedance may be rapid, automatic and resettable from configuration settings stored in a memory and/or with a user interface. These configuration settings may be inductance and capacitance value settings of a variable impedance load in relation to desired complex impedances at test frequencies. This variable impedance load may be used for match and sensor qualifications in an automatic and/or manual test environment. Programs may be derived to run test, qualification and troubleshooting of RF generators and associated impedance matching networks at the factory during equipment testing, qualification and/or at vendor/customer manufacturing facilities during equipment testing and/or trouble shooting.

Built-in radio frequency (RF) voltage and current sensors measure RF voltage and RF current, and phase angle is determined therefrom as disclosed herein for determining load impedances as they change in real time during equipment testing, qualification and/or at vendor/customer manufacturing facilities during equipment testing and/or trouble shooting. Phase angle is determined by the lead or lag times between the RF voltage V(t) and RF current I(t) waveforms and is expressed in degrees θ. RF power P(t) is the product of voltage and current, or P(t)=V(t)*I(t), while the respective RMS (root-mean-square) values after sensor detection are P=V*I*cos θ, where θ is the phase angle between the voltage and current waveforms. Using Ohm's Law Z(t)=V(t)/I(t) or Z may be expressed as Z=R+jX, where R=Z cos θ and jX=Z sin θ. jX=jωL−j/ωC, where ω=2πf, f is in frequency, C is in farads and L is in henrys. R is resistance in ohms and jX is reactance in ohms, where +jX is inductive reactance and −jX is capacitive reactance. Power is frequency independent and impedance is frequency dependent.

Embodiments disclosed herein provide for the necessary equipment hardware, e.g., inductors, variable capacitance capacitors, a high-power RF dummy load (e.g., water cooled resistor) and RF sensors necessary for all match and sensor qualification requirements. Operation and control of the wideband complex impedance load disclosed herein may be adapted for remote, automated computer control such as, for example but is not limited to, Ethernet for Control Automation Technology (EtherCAT) or (ECAT) compliance and communications with user interfaces, e.g., laptop computer, and plasma chamber tools. A manual/fully automatic wideband complex impedance load may be adapted for use as a portable system for field testing and equipment debugging at any location.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted is a schematic block diagram of a wideband variable impedance test load coupled to an RF generator and impedance matching network, according to specific example embodiments of this disclosure. A wideband variable impedance test load 100 may comprise a fixed value resistor 102, an RF power sensor (wattmeter) 104, a variable impedance network 106, RF voltage and current sensors 108, a frequency detector 110, a test unit controller 112, temperature sensors 114, a memory 116 and an interlock circuit 118. The fixed value resistor 102 may be a water cooled non-inductive resistor for high power operation. The RF generator may be a high-power RF generator capable of generating kilowatts of RF power at one or more RF frequencies.

A radio frequency power source 130 may comprise a radio frequency generator 132, forward and reverse RF power sensors 134 and/or voltage and current sensors, and an impedance matching network 136. An output of the impedance matching network 136 may be coupled to an input of the variable impedance network 106 through the RF voltage and current sensors 108. Measurement of forward and reverse RF power with the forward and reverse RF power sensors 134 may be used to derive standing wave ratio (SWR). In some example embodiments described hereinafter, the radio frequency power source 130 may be a device under test (DUT).

A user interface 140, e.g., computer (laptop), may communicate with the test unit controller 112 of the wideband variable impedance test load 100, and to the RF generator 132, the forward and reverse RF power sensors 134 and the impedance matching network 136. A more detailed description of the test unit controller 112 is shown in FIG. 3 and described in the specification hereinafter.

The test unit controller 112 may communicate with and control motorized variable capacitors (FIGS. 2A-2B) in the variable impedance network 106. The test unit controller 112 may also communicate with the RF voltage and current sensors 108, the frequency detector 110, the memory 116, the interlock circuit 118, and the temperature sensors 114. The test unit controller 112 may be used to communicate with the user interface 140 or other monitoring and control systems (not shown). Variable impedance load settings and automatic testing procedures may be stored in the memory 116 and may be executed by a processor within the test unit controller 112. Load impedance may be adjusted by the motorized vacuum variable capacitors (not shown) in the variable impedance network 106 and proper operation may be verified by the RF voltage and current sensors 108 at the input of the variable impedance load 100. Measurement readings from the RF voltage and current sensors 108 may be used to precisely control the variable load impedance at different target frequencies. In order to keep stable and consistent complex load values, temperature may be monitored in real time at multiple locations in the variable impedance load 100 with the temperature sensors 114. The interlock circuit 118 may also be implemented for safety purposes to control over temperature switches (not shown), cable-in-place switches (not shown), and match-in-place switches (not shown). In addition, for example but not limited to, a water cooled 50-ohm resistor 102 may be used as a fixed resistive load for high RF power operation and may be coupled to the output side of the variable impedance network 106 via the RF power sensor 104 (wattmeter).

Figure 2A:
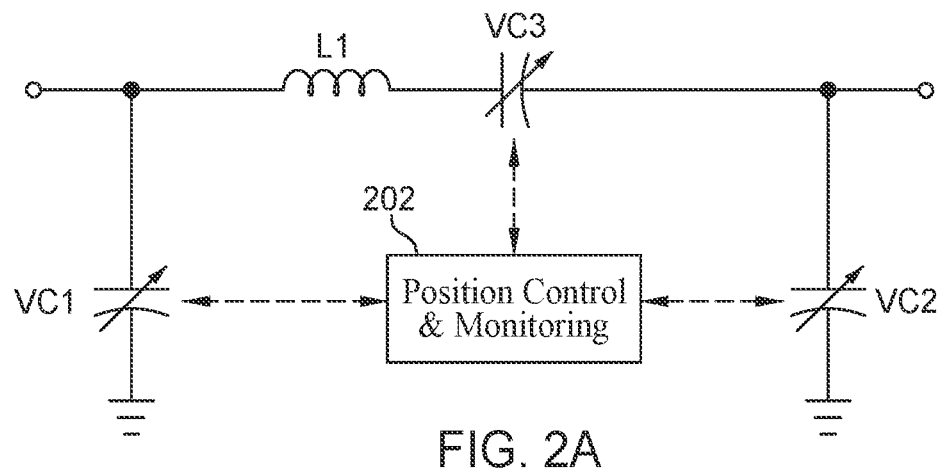
FIGS. 2A and 2B are schematic diagrams of RF impedance matching circuits, according to specific example embodiments of this disclosure.
Figure 2B:
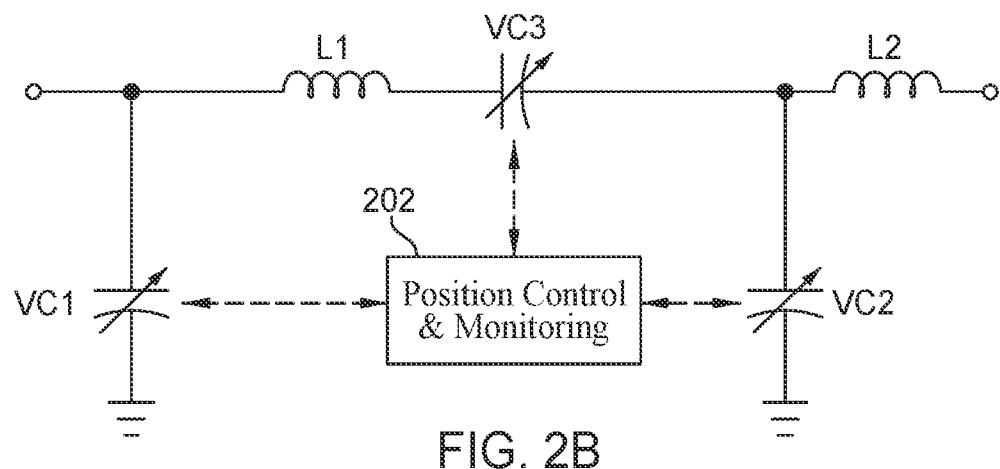

Referring to FIGS. 2A and 2B, depicted are schematic diagrams of RF impedance matching circuits, according to specific example embodiments of this disclosure. In FIGS. 2A and 2B, three variable capacitors VC1, VC2 and VC3, e.g., motorized vacuum variable capacitors are shown. They may have a capacitive range, but are not limited to, from about 3 pF to about 5000 pF. L1 is an inductor and may have an inductive range of, but is not limited to, about 0.01 µH to about 1000 µH. VC3 may be used to adjust a target frequency from about 100 kHz to about 250 MHz, and VC1 and VC2 may be used to tune to a target impedance. In some embodiments, especially complex loads for lower frequencies, the RF circuit schematic configuration shown in FIG. 2B may be implemented. An additional inductor L2 may be added before the 50-ohm resistor load 102 for adjusting the variable impedance network 106 to a desired value. Inductor L2 may be in a range of, but is not limited to, about 0.01 µH to about 1000 µH. A low pass Pi matching circuit is shown in FIGS. 2A and 2B. In some embodiments, the RF matching circuit may be an L type circuit with two motorized vacuum variable capacitors, e.g., VC1 and VC3 only. The capacitance and/or inductance values of the variable elements, e.g., VC1, VC2, VC3; may be controlled and monitored by a position control and monitoring circuit 202 for each variable element (one shown). Additional capacitors and/or inductors may also be switched into the matching circuit as required (not shown). A motor position actuator of the position control and monitoring circuit 202 may also include a position sensor that indicates the mechanical position of the adjustable element, e.g., amount of shaft rotation of the variable vacuum capacitor or a synchronized stepper motor position count after minimum and maximum rotation positions have been determined (detection of maximum and minimum clockwise and counter-clockwise shaft rotations). Position values may be correlated in a capacitance (or inductance)—position value table so that capacitance and/or inductance values may be monitored and set to a desired position based upon a required capacitance/inductance value. Element position values may be used for monitoring, presetting and testing according to the teachings of this disclosure.

Figure 3:
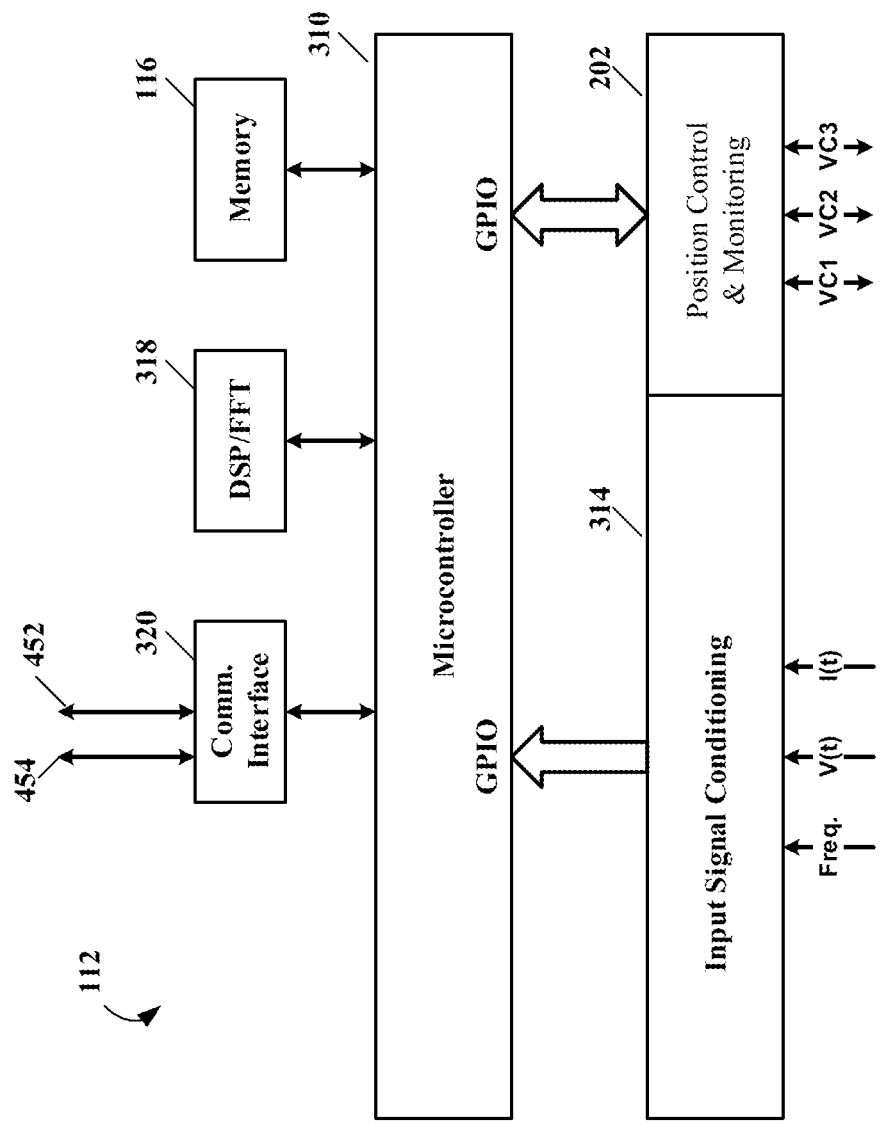
FIG. 3 illustrates a schematic block diagram of a test unit controller, according to specific example embodiments of this disclosure.

Referring to FIG. 3, depicted is a schematic block diagram of a test unit controller, according to specific example embodiments of this disclosure. The test unit controller 112 may monitor and control the variable impedance load 100 circuit elements. The test unit controller 112 may comprise a microcontroller 310, a memory (volatile and/or non-volatile) 116, a communications interface 320, input signal conditioning 314, and stepper motor drivers and position sensors 202. In addition, the microcontroller 310 may have a digital signal processing (DSP) and fast Fourier transform (FFT) capabilities in either an internal core processor or an external DSP/FFT processor 318. The microcontroller 310 may provide general purpose inputs and outputs (GPIO) for coupling to the input signal conditioning 314, voltage V(t), current I(t) and frequency (f), and the stepper motor drivers and position sensors 202. The voltage V(t) and current I(t) and frequency (f) data from the RF voltage and current sensors 108, and the frequency detector 110 may be input in real time to the microcontroller 310. The microcontroller 310 may then determine phase, and with frequency, determine the impedance at the input of the variable impedance network 106. The microcontroller 310 may also be in communications via the communications interface 320. The communications interface 320 may be adapted for communicating with protocols such as, for example but is not limited to, Ethernet for Control Automation Technology (EtherCAT) or (ECAT) compliance and serial RS-232, Ethernet, WiFi and Bluetooth communications with user interfaces, e.g., laptop computer, and plasma chamber tools. Software instructions (program) and data may be coded and stored within the memory 116 for processing by the external DSP/FFT processor 318. A software program (or computer instructions) readable by the processor in the test unit controller 112 determines which tasks may be performable by the components in the variable impedance load 100. Typically, the program, which is readable by the processor (e.g., microcontroller 310) in the variable impedance load 100, includes code, which, when executed by the processor, performs tasks relating to the testing scenarios described herein. The program may include instructions that may be used to control the various hardware and electrical components within the variable impedance load 100 to perform the various process tasks and various process sequences used to implement the methods described herein. In one embodiment, the program includes instructions that may be used to perform one or more of the operations described below in relation to FIGS. 5A, 7A and 8A.

Figure 4:
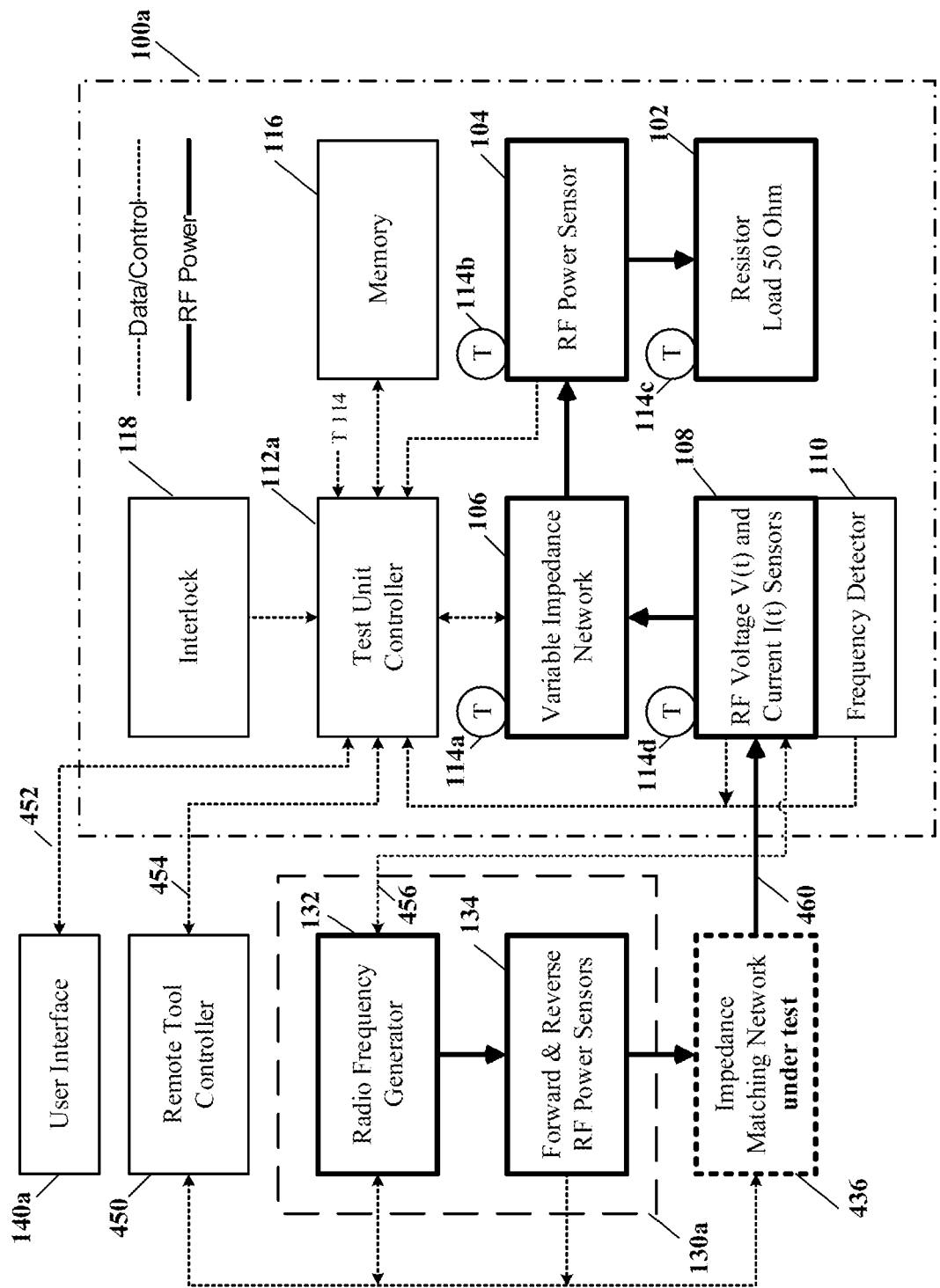
FIG. 4 illustrates a schematic block diagram of an ECAT controlled variable impedance load coupled to an RF generator and impedance matching network under test, according to specific example embodiments of this disclosure.

Referring to FIG. 4, depicted is a schematic block diagram of an ECAT controlled variable impedance load coupled to an RF generator and impedance matching network under test, according to specific example embodiments of this disclosure. According to the circuit shown in FIG. 4, the variable impedance load 100*a* may have three motorized vacuum variable capacitors in the RF circuit (see FIGS. 2A-2B and 3) of the variable impedance network 106; RF voltage and current sensors 108, a frequency detector 110 at the input of the variable impedance network 106, an interlock circuit 118, a local memory 116, multiple temperature sensors 114 and a 50-ohm resistor load 102, e.g., a water cooled non-inductive resistor for high power dissipation. All of these internal devices may be controlled by a local controller, e.g., test unit controller 112*a*, for example but not limited to, communicating using Ethernet for Control Automation Technology (EtherCAT) over a communication line 454. EtherCAT is a real time industrial Ethernet protocol. Due to short cycle time and low jitter, EtherCAT has benefits of high speed and accurate synchronization. The test unit controller 112*a* may serve as a local EtherCAT master. All match components, e.g., RF voltage and current sensors 108 and frequency detector 110, variable impedance network 106, capacitor control 202 (FIG. 2A), may be EtherCAT slave devices, which may be controlled by the test unit controller 112*a*. During qualification tests, a new matching network 436 under test may be coupled between an RF generator 132 and the variable impedance load 100*a* through a 50-ohm transmission line 460. The RF generator 132 may supply RF power at frequencies from about 100 kHz to about 250 MHz. A synchronization signal 456, e.g., transistor-transistor logic (TTL), may be provided to the RF voltage and current sensors 108 at the input of the variable impedance load 100*a* directly from the RF generator 132 or remote tool controller 450 for advanced pulse testing and debugging.

Plasma Chamber Process Simulation

Impedance, frequency and power associated with a plasma chamber process may be measured with RF voltage, RF current, RF frequency and RF power sensors, and the values therefrom may be recorded during a representative plasma chamber process using a qualified radio frequency power source and operational plasma chamber doing a demonstrative plasma process. The recorded RF voltage, RF current, RF frequency and RF power readings may then be used to create a test program for simulation of the representative plasma chamber process by controlling operation of the wideband variable impedance test load 100 in combination with an RF power source 130 under test. The operating parameters of a known good and properly operational radio frequency power source may also be recorded for comparison with subsequently measured parameters of another radio frequency power source 130 under test. A library of different plasma chamber process simulations may be created for testing of RF power sources and/or impedance matching networks under many different operating requirements and conditions. The library of different chamber process simulations and related data may be used to train one or more artificial intelligence (AI) or machine learning (ML) software application running in the test unit controller that may be able to diagnose issues with a component under test and/or help determine that the component under test is able to function within an acceptable range of performance.

When a radio frequency power source 130 to be tested is coupled to the wideband variable impedance test load 100 running the process simulation test programs, the wideband variable impedance test load 100 will simulate (appear to be) a plasma chamber by replicating the recorded plasma process parameters. All operational parameters of the RF power source 130 under test may be measured and stored during the simulated plasma process. For example, operation of the RF generator 132, RF power sensors 134 and impedance matching network 136 comprising the RF power source 130 under test may be monitored and recorded for proper operation thereof. The readings from the RF voltage and current sensors 108, RF frequency detector 110 and RF power 104 sensor may further be used for test verification purposes of the RF power source 130 under test. The readings from the RF voltage and current sensors 108, RF frequency detector 110 and RF power 104 sensor may be stored as RF voltage sensor data, RF current sensor data, frequency detector data and RF power data in memory 116. The measured and stored readings and/or operational parameters may then be compared to operational parameters from a qualified (known good) RF power source previously recorded, and a determination made of the calibration and operability of the radio frequency power source 130 under test based upon the process simulation test results.

The variable impedance matching network 106 may be adapted to transform the 50-ohm resistor 102 to the required simulated (measured) chamber impedance. Capacitance/inductance values may be calculated to make this impedance transformation. For example, once the capacitance values required for impedance transformation are determined then the variable capacitors (VC1, VC2, VC3) may be positionally set to obtain those capacitance values, for example but not limited to, with a position/capacitance lookup table.

Qualification Test Procedures

Referring to FIG. 4, a remote tool controller 450 may be provided for communicating with the impedance matching network 436 under test, RF generator 132 and the test unit controller 112a. The test unit controller 112a may communicate with the remote tool controller 450 using EtherCAT protocol on data communications line 454. The test unit controller 112a of the variable impedance load 100a may do a master to slave conversion which allows communication to the remote tool controller 450 acting as master on the EtherCAT data communications line 454. The test unit controller 112a may receive requests from the remote tool controller 450 and provide feedback thereto. Also, the remote tool controller 450 may receive forward and reflected power information from the RF power sensors 134 and thereby obtain data from the impedance matching network 436 under test. A cooperative intelligent qualification testing procedure may be achieved using the circuit configurations depicted and described herein. In addition, the user interface 140a and variable impedance load 100a (via test unit controller 112a) may feature serial control ports coupled via communications line 452 for uploading multipoint qualification procedures and complex load tuning algorithms by using an external software and application programming interface (API). The uploaded load tuning algorithms may include testing sequence recipes that may be used to simulate variations in the complex load during plasma ignition, variations in the complex load found during common processing plasma process sequences and other useful plasma processing simulations. Complex load impedances and variable capacitor motor positions may be monitored and accessed from external user interfaces 140a, e.g., laptop computers, which provides great flexibility in application and use of the variable impedance load 100a. Also, advanced complex load control and/or testing procedures may be deployed in real time. The variable impedance load 100a may operate fully autonomously, cooperatively with the remote tool controller 450 or manually controlled by the user interface 140a, e.g., computer laptop.

The wideband variable impedance test load 100a may be configured to provide a testing environment that may test over wide frequency/impedance ranges and may be used for RF power source 130 testing and debugging. The wideband variable impedance test load 100a may be fully and automatically controlled by the remote tool controller 450 and be tuned to different selected load impedances, for example but not limited to plasma chamber testing. The wideband variable impedance test load 100a may also be used for new RF power match equipment qualification in high volume manufacturing.

Real time readings at certain time intervals of the devices under test (DUT), e.g., RF voltage and current sensors 608 and real time phase derived therefrom, and tuning element positions of the impedance matching network 436 may be recorded along with a "time stamp" for each reading recorded. Temperature measurements from temperature sensors 114 may also be recorded and time stamped during a qualification test, along with RF generator power outputs correlated with DUT temperatures. From the recorded RF voltage, current, phase and time stamps thereof, impedance traces may be derived. An "impedance trace" is defined herein as a change in impedance over a time period. Tuning element position changes over a time period may be referred to as "tuning element position traces." Similarly RF voltage, current, phase, and power traces may be defined from the measured/calculated and stored values thereof correlated with the associate time stamps.

These derived traces may be used for dynamic qualification testing of the DUT. For example, dynamic qualification testing may be used to simulate impedance transition states such as the response time of an impedance matching network to an impedance change (from variable impedance network 106) by characterizing the time required for tuning element positions of the impedance matching network 436 to change to a new value to match the impedance change. Temperature rise over time (temperature trace) resulting from RF power supplied to the impedance matching network 436 may also be used to compensate for variation in temperature of the one or more affected components over time that are under test and thus in determining qualification of a DUT. Swept frequencies (varies from low to high frequencies) of RF power from a test RF generator may be used for testing RF filters. A variable frequency RF generator may be used for testing impedance matching networks over both impedance and frequencies ranges (traces).

Figure 5A:
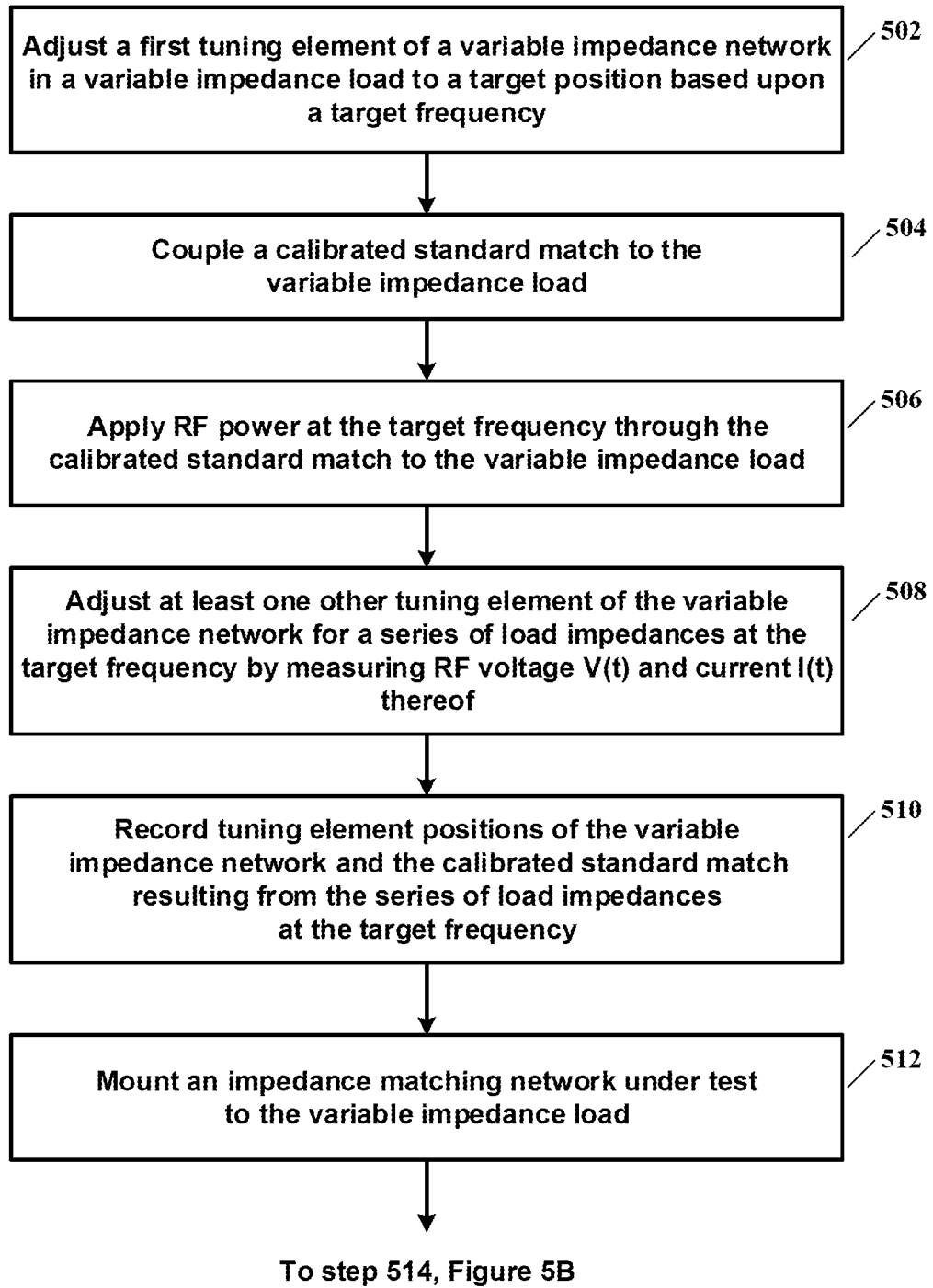
FIGS. 5A and 5B illustrate a flow chart of a method for running a multipoint match qualification of an impedance matching network, according to specific example embodiments of this disclosure.
Figure 5B:
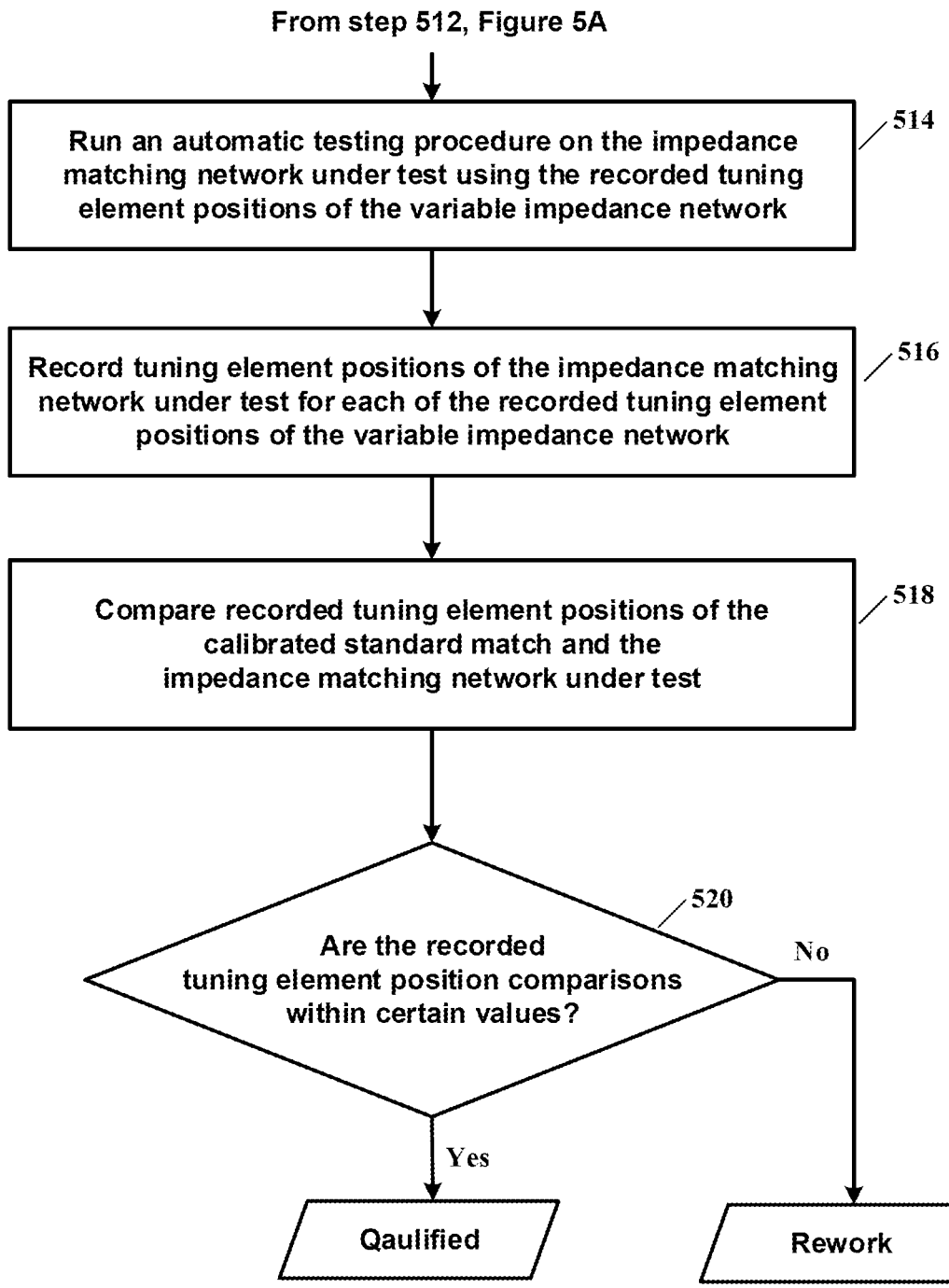

Referring to FIGS. 5A and 5B, depicted is a flow chart of a method for running a multipoint match qualification of an impedance matching network, according to specific example embodiments of this disclosure. This flow chart represents an example for running an automatic multipoint match qualification of an impedance matching network 436 (FIG. 4) under test. In step 502, a first tuning element, e.g., variable capacitor VC3, of the variable impedance network 106 may be adjusted to a target position (e.g., capacitance setting) based upon a target frequency. The target position(s) or settings may be determined empirically or from a pre-programmed test menu, and may be selected to simulate an impedance of a wideband variable impedance load found during a typical processing recipe that the impedance matching network will experience during operation, such as a step within a plasma processing recipe. In step 504, a calibrated standard (qualified) match may be coupled to the variable impedance load 100a. In step 506, RF power at a target frequency may be applied through the calibrated standard match to the input node of the variable impedance load 106 that may be coupled to the transmission line 460.

In step 508, tuning elements of the variable impedance network 106 may be adjusted for desired test load impedances as calculated from the RF voltage and current measured by the RF voltage and current sensors 108. The frequency would be known from the frequency setting of the RF generator 132 or may be measured by the frequency detector 110. In step 510, the tuning element positions of the variable impedance network 106 and the calibrated standard (qualified) match for each of the test load impedances at the target frequencies may be recorded (stored in memory 116). Optionally, recording a plurality of tuning element positions (position traces) of the calibrated standard (qualified) match during position transitions may be time stamped for creating and comparing response times thereof. These test load impedances may then be used as testing points for the qualification of other unqualified impedance matching networks 436 that are under test. As is discussed further below, the stored test load impedances may include data relating to the various component settings and impedances traces over time as a way to determine if the matching networks 436 is functioning correctly and/or predict any possible future device component failures. The stored information may be stored in memory as a lookup table or a real-time map measured using a network analyzer. The stored information may include RF voltage data, RF current data and/or frequency data, which was previously collected by the RF voltage and current sensors 108 and frequency detector 110 and stored in memory. In step 512, an impedance matching network 436 under test is mounted to and in RF communications with the variable impedance load 100a (variable impedance network 106). In step 514, an automatic testing procedure may be performed on the impedance matching network under test using the recorded (stored) tuning element positions of the variable impedance network.

In step 516, the tuning element positions of the impedance matching network 436 under test (DUT) may be recorded for each of the test load impedances presented during testing. Optionally, recording a plurality of tuning element positions (position traces) of the match DUT during position transitions may be time stamped for creating and comparing the response times (position traces) of the match DUT to the position traces of the previously recorded calibrated standard (qualified) match. In step 518, the recorded tuning element positions of the impedance matching network 436 under test for each of the test load impedances may be compared to the recorded (stored) tuning element positions of the calibrated standard (qualified) match at those same test load impedances. The position traces for of both the match DUT and qualified match may be compared for dynamic position qualification of the match DUT. In step 520, if the comparisons between the tuning element positions, and optionally dynamic position transition times, of the qualified match 638 and the impedance matching network 436 under test are within certain acceptable values, then the impedance matching network 436 under test may be deemed "qualified." If not, then the impedance matching network 436 is not qualified and must be repaired and/or recalibrated (reworked). Similar testing may be used to verify tuning element match ranges and synchronizations of the adjustable tuning element positions with expected capacitance/inductance values.

Sensor Calibration

Figure 6:
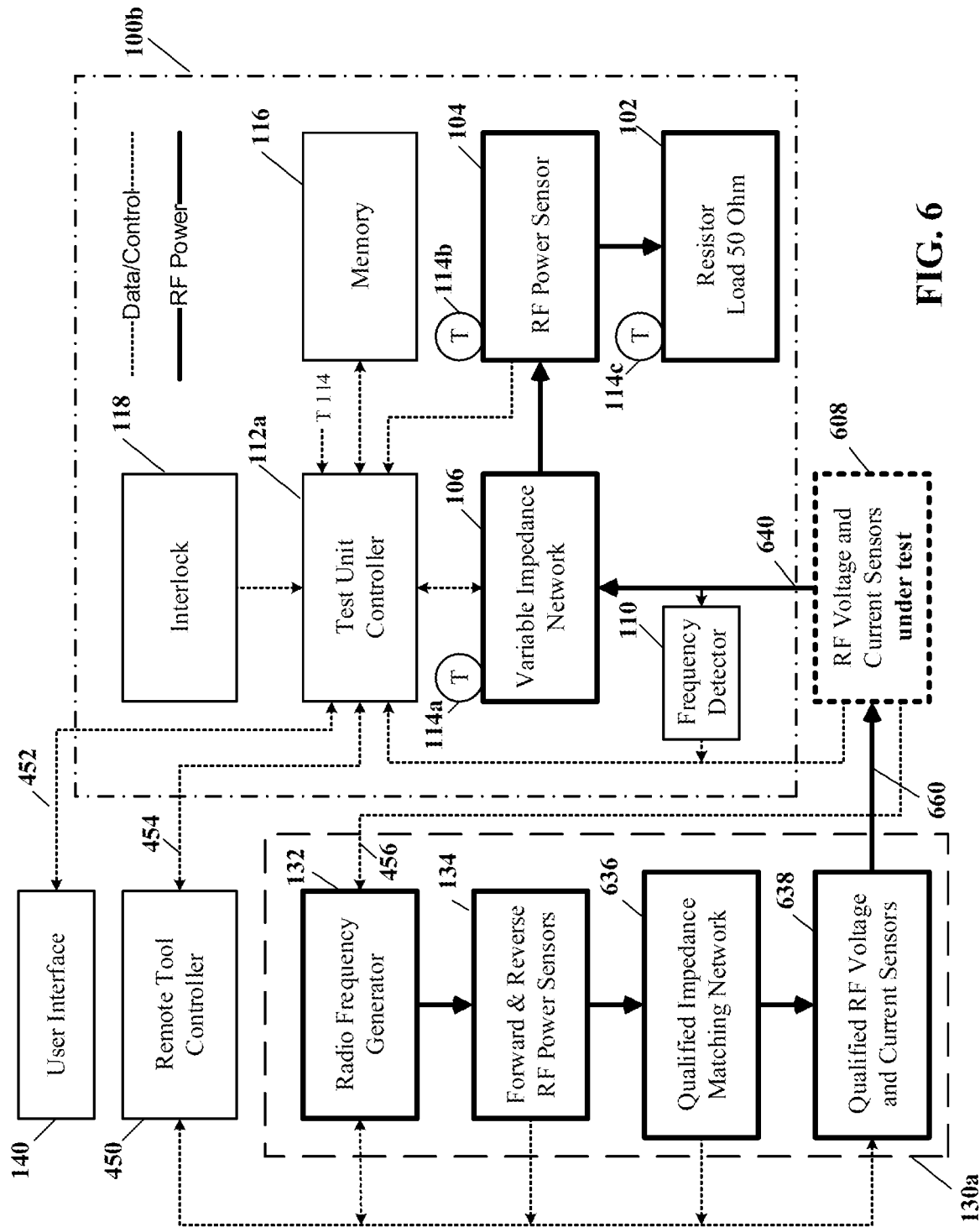
FIG. 6 illustrates a schematic block diagram of a system that may be adapted for sensor qualification and calibration using a wideband variable impedance load, according to specific example embodiments of this disclosure.

Referring to FIG. 6, depicted is a schematic block diagram of a system that may be adapted for sensor qualification and calibration using a wideband variable impedance load, according to specific example embodiments of this disclosure. A qualified impedance matching network 636 e.g., one having calibrated and qualified matching element settings, and calibrated and qualified RF voltage and current sensors 638 may be coupled between an RF generator 132 and a variable impedance load 100b. The RF voltage and current sensors 608 under test may be mounted at an input 640 of the variable impedance load 100b and be calibrated and certified by comparing readings of the RF voltage and current sensors 608 under test with the readings of the qualified and calibrated RF voltage and current sensors 638 at various complex impedance settings of the variable impedance network 106.

Figure 7A:
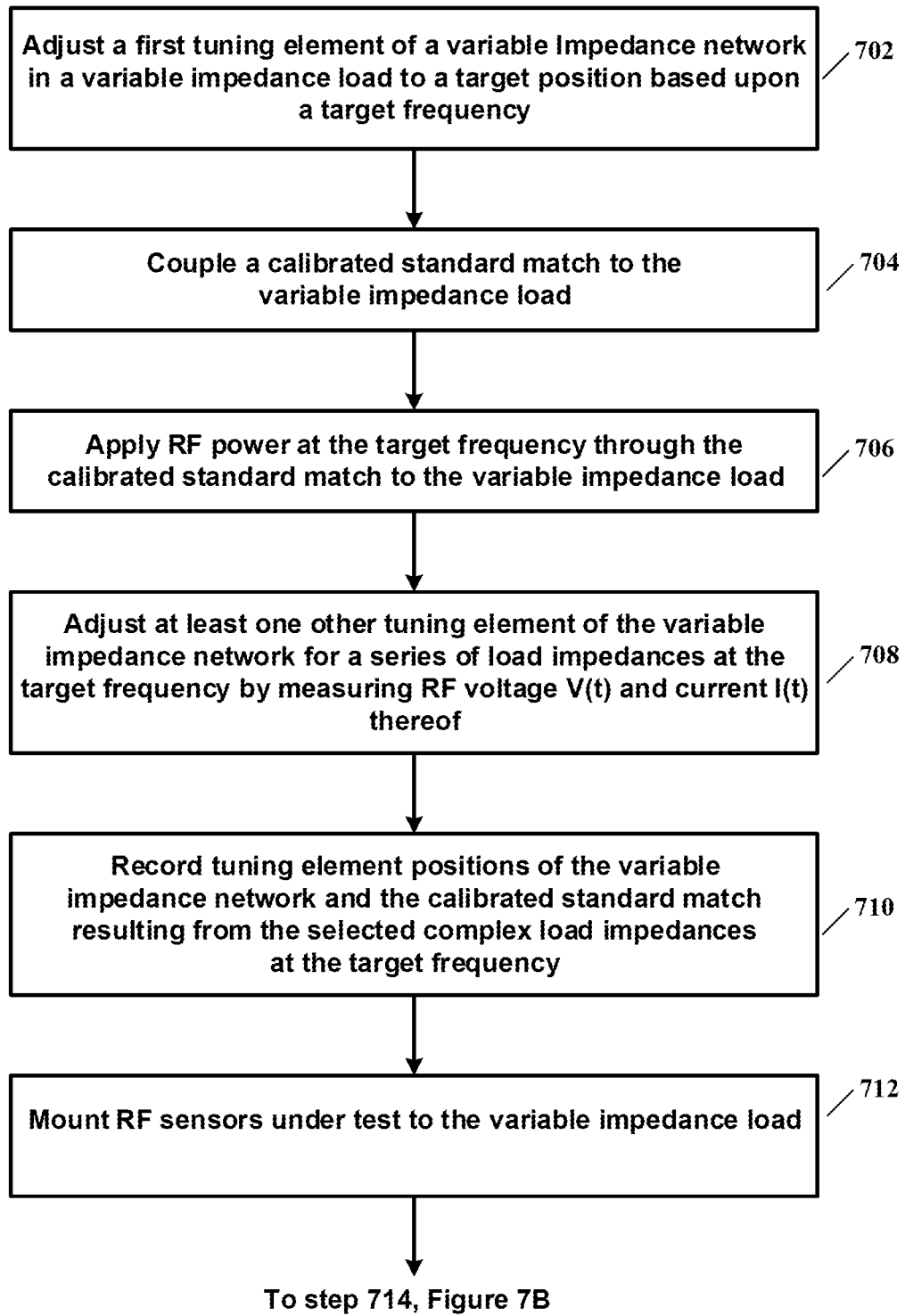
FIGS. 7A and 7B illustrate a flow chart of a method for sensor qualification and calibration using a wideband variable impedance load, according to specific example embodiments of this disclosure.
Figure 7B:
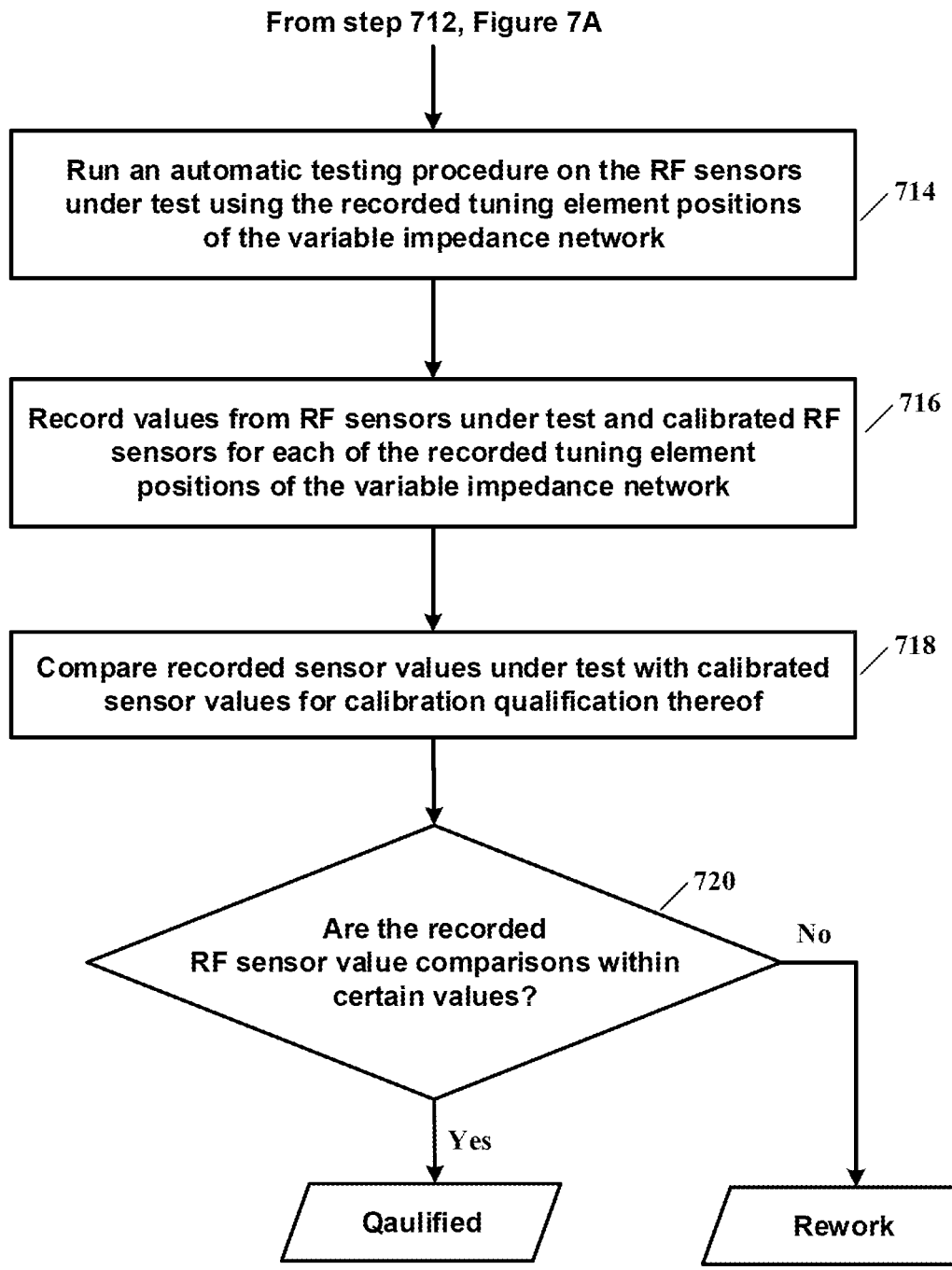

Referring to FIGS. 7A and 7B, depicted is a flow chart of a method for sensor qualification and calibration using a wideband variable impedance load, according to specific example embodiments of this disclosure. This flow chart represents an example for running an automatic multipoint sensor qualification and calibration using the equipment configuration shown in FIG. 6. In step 702, a first tuning element, e.g., variable capacitor VC3, of the variable impedance network 106 may be adjusted to a target position (e.g., capacitance setting) based upon a target frequency. The target position(s) or settings may be determined empirically or from a preprogrammed test menu. In step 704, a calibrated standard (qualified) match may be coupled to the variable impedance load 100a. In step 706, RF power at a target frequency may be applied through the calibrated standard match to the input node of the variable impedance load 106 that may be coupled to the transmission line 660.

In step 708, tuning elements of the variable impedance network 106 may be adjusted for desired test load impedances as calculated from the RF voltage and current measured by the qualified RF voltage and current sensors 638. The frequency would be known from the frequency setting of the RF generator 132 or may be measured by the frequency detector 110. In step 710, the tuning element positions of the variable impedance network 106 for each of the test load impedances at the target frequencies may be recorded (stored in memory 116). Optionally, recording a plurality of tuning element positions (position traces) of the variable impedance network 106 during position transitions may be time stamped for creating and comparing response times thereof. These test load impedances may then be used as testing points for the calibration and qualification of RF voltage and current sensors 608 under test. In step 712, RF voltage and current sensors 608 under test may be mounted to and in RF communications with the variable impedance load 100b (variable impedance network 106). In step 714, an automatic testing procedure may be performed on RF voltage and current sensors 608 under test using the recorded (stored) tuning element positions of the variable impedance network.

In step 716, the information from the RF sensors 608 under test and the qualified RF voltage and current sensors 638 may be recorded for each of the test load impedances presented during testing (recorded tuning element positions). Optionally, recording a plurality of sensor readings (current and voltage) of the RF sensors under test during position transitions of the tuning elements that may be time stamped for subsequent voltage and current traces of the RF sensors under test. In step 718, the information from RF voltage and current sensors 608 under test may be compared with the RF voltage data and RF current data collected from qualified (calibrated) RF voltage and current sensors 638. Optionally, comparison of the dynamic voltage and current traces of the RF voltage and current sensors 608 under test and the qualified (calibrated) RF voltage and current sensors 638 may be determined. In step 720, if the recorded sensor value comparisons between the qualified (calibrated) RF voltage and current sensors 638 and the RF voltage and current sensors 608 under test are within certain acceptable values, and optionally RF voltage and current trace times, then the RF voltage and current sensors 608 under test are deemed calibrated or "qualified." If not, then the RF voltage and current sensors 608 under test are not qualified and must be repaired and/or recalibrated (reworked).

Match Tuning and Filter Performance Qualifications

Referring to FIGS. 8A and 8B, depicted are schematic block diagrams for forward and reverse RF transmission configurations, respectively, for match tuning and filter performance qualifications, according to specific example embodiments of this disclosure. FIG. 8A shows a forward RF power test setup that may be used to verify tuning positions of impedance matching networks under test. In the forward RF power test setup, an RF generator 130a, may be set to a match target frequency, connected to an input of an impedance matching network 836 under test, and a variable impedance load 100a may be connected to an output thereof through 50-ohm coaxial transmission lines. The testing process may be completed using the forward RF power test setup illustrated in FIG. 8A and may be similar to the method illustrated in FIG. 5A, and discussed above.

FIG. 8B shows a reverse RF power test setup that may be used to check RF filter performance. In the reverse RF power test setup, an RF generator 130*b* not at the match target frequency may be connected to an output of an impedance matching network 838 under test and a variable impedance load 100*b* may be connected to an input thereof through 50-ohm transmission lines. Built-in RF sensors (not shown) at the input of the variable impedance load 100*b* may measure power reaching the variable impedance load 100*b* and other parameters to verify RF filter performance. The RF generator frequency in the reverse RF power test setup of FIG. 8B may generally be determined based on available RF power frequencies and possible harmonic frequencies in a plasma processing chamber.

Dynamic Qualification Test Procedures

Each of the aforementioned qualification test procedure steps may be performed using multiple settings of the tuning element positions of the variable impedance network over certain periods of time, e.g., real-time complex impedance control over time. Thus producing impedance traces, e.g., a series of a single-point impedance settings stored over a period of time. Such impedance traces, when measured in combination with a qualified impedance matching network and/or qualified RF voltage and current sensors, may be stored in a memory of a test unit controller and/or a tool controller. The stored impedance traces over time may then be used for dynamically testing and analysis of a device under test (DUT). Impedance traces may converted and/or stored in memory so that the tuning element positions of the variable impedance network over certain periods of time may be used to adjust portions of the testing process and/or determine how a DUT is performing. Therefore, the various dynamic parameters of a DUT may be evaluated by using the recorded impedance traces. The dynamic measurements may thus provide additional process qualification criteria to assure that the DUT is functioning as expected and as desired over a wider range of process settings.

In some embodiments, the test unit controller and/or a tool controller may be configured to run test sequences on the DUT autonomously. During these test sequences the test unit controller and/or tool controller may be configured to adjust, for example, the RF power level and frequency of the RF signal provided from the RF source, and adjust the impedances created by the variable impedance network by adjusting the settings of the tuning element positions over certain periods of time. The test unit controller and/or tool controller may also be configured to receive feedback from the RF voltage and current sensors 108, frequency detector 110 and/or a temperature sensor to improve the control of the impedance created by the variable impedance network during the testing of the DUT.

For example, but is not limited to, instantaneous and measured response times of the variable capacitors VC1, VC2 and VC3; and test repeatability of the settings for the variable capacitors VC1, VC2 and VC3 may be used to improve the DUT qualification process and/or determine how a DUT is performing. Temperature profiles of the impedance matching network taken over time and at various RF power levels may also be collected. Frequency sweeping by the RF generator may be used for testing of impedance matching networks, RF filters and RF sensors/detectors. Dynamic testing repeatability of an impedance matching network and/or RF voltage and current sensors may be determined.

Measured impedances values, impedance traces and/or tuning element positions of the variable impedance network over certain periods of time may be stored in the test unit controller and/or tool controller and be used to perform dynamic testing and qualification of DUTs. The measured impedance values, impedance traces and or tuning element positions information may be stored in memory, a lookup table, or a map measured using a network analyzer for analysis purposes. Varying RF power levels, RF frequencies and test load impedances (tuning element positions of the variable impedance network) over time, while monitoring RF sensor (voltage and current) readings, phase, frequency and temperature of DUTs then comparing the resulting measurements with the same measurements previously made from a qualified matching network and RF sensors stored in a memory may be used to determine whether the DUT meets desired qualification standards. The tool controller may run test sequences autonomously, including but not limited to, changing power level, frequency and load impedances. Feedback control of the variable impedance network, along with real-time temperature monitoring and compensation, may be used to improve the accuracy of the impedance set by the variable load impedance during testing and thus improve the DUT qualification process.

In one example of a dynamic qualification testing process, the test unit controller and/or tool controller may be used to measure and qualify the dynamic response of a DUT. Initially, during the dynamic qualification testing a plurality of position settings of at least one of the variable capacitors VC1, VC2 and VC3 of the variable impedance network may be stored in memory so that the variable capacitor settings may be used to test a series of selected complex load impedances during a future testing sequence. Next, a calibrated standard match may be connected to the output of an RF source and the input of the variable impedance network that may be connected to load resistor. Then RF power may be applied through the calibrated standard match, variable impedance network and load resistor, while the RF voltage and current sensors, frequency sensors and temperature sensors collect data as the complex impedance is varied in real time using the previously stored the variable capacitor settings. During the testing of the calibrated standard match, feedback may be provided by the sensors to allow the test unit controller and/or a tool controller to control the settings of the variable capacitors and/or RF generator frequency to form load impedance traces, while the variable capacitor positions, response time, RF voltage data, RF current data, frequency data is collected. The formed load impedance traces may then be stored in memory. Then the dynamic qualification testing process may be performed a plurality of times on a DUT using an automatic testing procedure that utilizes one or more stored impedance traces for qualification of the DUT.

Additionally, in some other embodiments, a dynamic qualification testing process may use prior formed impedance traces to qualify a DUT. The impedance trace data may be determined and/or predicted from data collected during prior test runs. Alternately, a user may define impedance traces by uploading prior collected data or by use of a user interface. Initially, during the dynamic qualification testing a plurality of position settings of at least one of the variable capacitors VC1, VC2 and VC3 of the variable impedance network may be stored in memory so that the variable capacitor settings may be used to test a series of selected complex load impedances during a future testing sequence. The created impedance trace may be stored in memory as a lookup table or a map measured using a network analyzer. Next, a DUT is connected to the output of an RF source and the input of the variable impedance network that is connected to a load resistor. Then the dynamic qualification testing process may be performed a plurality of times on the DUT using an automatic testing procedure that utilizes one or more of the stored impedance traces. During the testing of the DUT, feedback may be provided by the sensors to allow the test unit controller and/or a tool controller to control the settings of the variable capacitors and/or RF generator frequency to form DUT impedance traces, while the variable capacitor positions, response time, RF voltage data, RF current data, frequency data and/or temperature data is collected in real time. The formed DUT impedance traces may then be stored in memory. The collected data, which includes the DUT impedance traces, may then be compared with stored qualification data to determine if the DUT has met a desired set of criteria.

The present disclosure has been described in terms of one or more embodiments, and it should be appreciated that many equivalents, alternatives, variations, and modifications, aside from those expressly stated, are possible and within the scope of the disclosure.

What is claimed is:

1. A system for analyzing, qualifying or testing radio frequency (RF) components, comprising:
    a variable impedance network comprising:
        a first node that is adapted for coupling to a first resistance element; and
        adjustable tuning elements for transforming the resistance coupled to the first node into a plurality of impedances at a second node, wherein the second node is configured to be coupled to an RF power source; and
    an impedance matching network having an input coupled to an output of the RF power source and an output adapted for coupling to the second node of the variable impedance network; and
    one or more RF voltage sensors, one or more RF current sensors, and a frequency detector that are each coupled to the second node of the variable impedance network; and
    a test unit controller coupled to the adjustable tuning elements, wherein the test unit controller is programmed to perform operations comprising:
        controlling the adjustment of the adjustable tuning elements for selected ones of the plurality of impedances at the second node; and
        determining that the impedance matching network is qualified by comparing a signal from at least one of RF voltage sensors, RF current sensors or the frequency detector to at least one of RF voltage sensor data, RF current sensor data and frequency detector data stored in memory.

2. The system of claim 1, wherein the first resistance element is a fixed value resistor coupled to the first node of the variable impedance network, wherein the resistance of the fixed value resistor is 50 ohms.

3. The system of claim 1, wherein the variable impedance network is adapted to receive an RF signal from the RF power source that has a frequency within a range of from about 100 kHz to about 250 MHz.

4. The system of claim 1, further comprising an RF power sensor coupled between the first node of the variable impedance network and the resistance.

5. The system of claim 1, wherein the test unit controller comprises:
    a microcontroller having
        inputs coupled to the RF voltage and RF current sensors, and the frequency detector,
        inputs and outputs for monitoring positions of and controlling the adjustable elements of the variable impedance network, and
        a memory that includes information relating to a plurality of settings of one or more of the adjustable tuning elements stored therein;
    wherein the plurality of settings of one or more of the adjustable tuning elements are configured to be used to create the plurality of impedances at the second node.

6. The system of claim 1, wherein the RF power source comprises an RF generator.

7. The system of claim 6, wherein the RF generator is a high-power RF generator.

8. A system for analyzing, qualifying or testing radio frequency (RF) components, comprising:
    a radio frequency (RF) power source comprising an RF generator; and
    an impedance matching network having an output and input coupled to an output of the RF generator;
    a wideband RF variable impedance test load comprising:
        a variable impedance network comprising:
            a first node that is adapted for coupling to a resistance; and
            adjustable tuning elements for transforming the resistance coupled to the first node into a plurality of impedances at a second node, wherein the second node is configured to be coupled to the output of the impedance matching network; and
        one or more RF voltage sensors, one or more RF current sensors and a frequency detector that are each coupled between the second node of the variable impedance network and the output of the impedance matching network; and
        a test unit controller coupled to the adjustable tuning elements, wherein the test unit controller is programmed to perform operations comprising:
            controlling adjustment of the adjustable tuning elements for selected ones of the plurality of impedances at the second node; and
            qualifying the impedance matching network or RF voltage sensor by comparing a signal from at least one of RF voltage sensors, RF current sensors or the frequency detector to at least one of RF voltage sensor data, RF current sensor data and frequency detector data stored in memory.

9. The system of claim 8, further comprising forward and reverse RF power sensors coupled between the output of the RF generator and the input of the impedance matching network.

10. The system of claim 8, further comprising an RF power sensor coupled between the first node of the variable impedance network and the resistance.

11. The system of claim 10, wherein the test unit controller comprises:
    a microcontroller having
        inputs coupled to the RF voltage and RF current sensors, and the frequency detector,
        inputs and outputs for monitoring positions of and controlling the adjustable elements of the variable impedance network,
        a memory that includes information relating to a plurality of settings of one or more of the adjustable tuning elements stored therein, and
        a communications interface;
    wherein the plurality of settings of one or more of the adjustable tuning elements are configured to be used to create the plurality of impedances at the second node.

12. The system of claim 8, further comprising a user interface for controlling testing operations of the RF power source and the wideband RF variable impedance test load.

13. The system of claim 12, wherein a remote tool controller is in communication with the communications interface of the test unit controller.

14. A method of analyzing, qualifying or testing radio frequency (RF) components, comprising:
- delivering, by use of an RF generator, a first RF signal through an impedance matching network to a first node of a variable impedance network, wherein the variable impedance network comprises:
  - a controller;
  - a second node that is adapted for coupling to a resistance element;
  - adjustable tuning elements for transforming the resistance of the resistance element coupled to the second node into a plurality of load impedances at the first node; and
  - an RF voltage sensor, an RF current sensor, and a frequency detector that are each coupled between the first node and the adjustable tuning elements;
- matching, by use of the impedance matching network, a first impedance of the RF generator to a first impedance of the plurality of load impedances created at the first node of the variable impedance network, wherein the first impedance of the plurality of load impedances is created by adjusting one or more of the adjustable tuning elements; and
- qualifying the impedance matching network or RF voltage sensor if a signal from the RF voltage sensor, the RF current sensor or the frequency sensor are within a range set relative to at least one of RF voltage sensor data, RF current sensor data and frequency detector data stored in memory, while the first impedance of the RF generator is matched to the first impedance of the plurality of load impedances.

15. The method of claim 14, further comprising:
- delivering, by use of an RF generator, a second RF signal through an impedance matching network to the first node of the variable impedance network;
- matching, by use of the impedance matching network, a second impedance of the RF generator to a second impedance of the plurality of load impedances created at the first node of the variable impedance network, wherein the second impedance of the plurality of load impedances is created by adjusting the one or more of the adjustable tuning elements; and
- wherein the qualifying the impedance matching network or RF voltage sensor further comprises qualifying the impedance matching network or RF voltage sensor if a signal from the RF voltage sensor, the RF current sensor or the frequency sensor is within a range set relative to at least one of RF voltage sensor data, RF current sensor data and frequency detector data stored in memory while the first impedance of the RF generator is matched to the first impedance of the plurality of load impedances and the second impedance of the RF generator is matched to the second impedance of the plurality of load impedances.

\* \* \* \* \*